United States Patent [19]

Günther et al.

[11] Patent Number: 5,576,513

[45] Date of Patent: Nov. 19, 1996

[54] HF-TIGHT COMPONENT CARRIER

[75] Inventors: Hans-Ulrich Günther, Pfinztal; Klaus Pfeifer, Karlsruhe, both of Germany

[73] Assignee: Schroff GmbH, Straubenhardt, Germany

[21] Appl. No.: 92,414

[22] Filed: Jul. 16, 1993

[30] Foreign Application Priority Data

Jul. 16, 1992 [DE] Germany ............................ 42 23 322.4

[51] Int. Cl.[6] .................................................... H05K 9/00
[52] U.S. Cl. ............................................................ 174/35 R
[58] Field of Search ............................. 174/35 R, 356 C, 174/35 MS, 50, 52.1, 51; 361/816, 818; 277/901

[56] References Cited

U.S. PATENT DOCUMENTS

| | | | |
|---|---|---|---|
| 3,904,810 | 9/1975 | Kraus | 174/35 MS |
| 4,761,516 | 8/1988 | Reichert | 174/35 GC |
| 4,889,959 | 12/1989 | Taylor et al. | 174/35 GC |
| 4,929,802 | 5/1990 | Schaepers et al. | 174/35 MS |
| 5,029,254 | 7/1991 | Stickney | 174/35 GC |
| 5,162,610 | 10/1992 | Clifton et al. | 174/35 R |
| 5,239,127 | 8/1993 | Swikle et al. | 174/35 R |
| 5,250,751 | 10/1993 | Yamaguchi | 174/35 GC |
| 5,333,100 | 7/1994 | Anhalt et al. | 361/818 |

FOREIGN PATENT DOCUMENTS

| | | |
|---|---|---|
| 3523770 | 8/1987 | Germany . |
| 3928461 | 3/1991 | Germany . |
| 9106954.8 | 11/1991 | Germany . |

*Primary Examiner*—Bot L. Ledynh
*Attorney, Agent, or Firm*—Spencer & Frank

[57] ABSTRACT

In an HF-tight component carrier, a longitudinal groove having a V-shaped profile is proposed for sealing the cover from the upper module rails. A spring member, having a V-shaped cross section is inserted into this longitudinal groove in a fitting and clamping manner. The cover is equipped with edge strips which engage the longitudinal groove. The spring member is provided with a planar rear leaf including a spring tongue and an acutely-angled spring leaf with a claw.

10 Claims, 2 Drawing Sheets

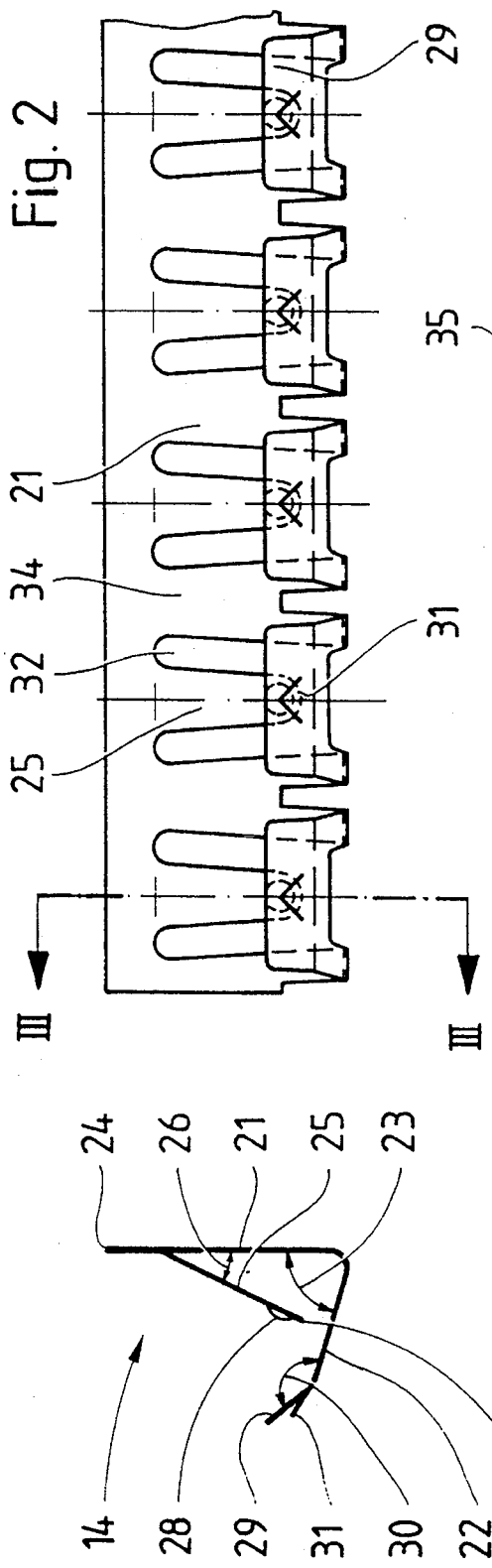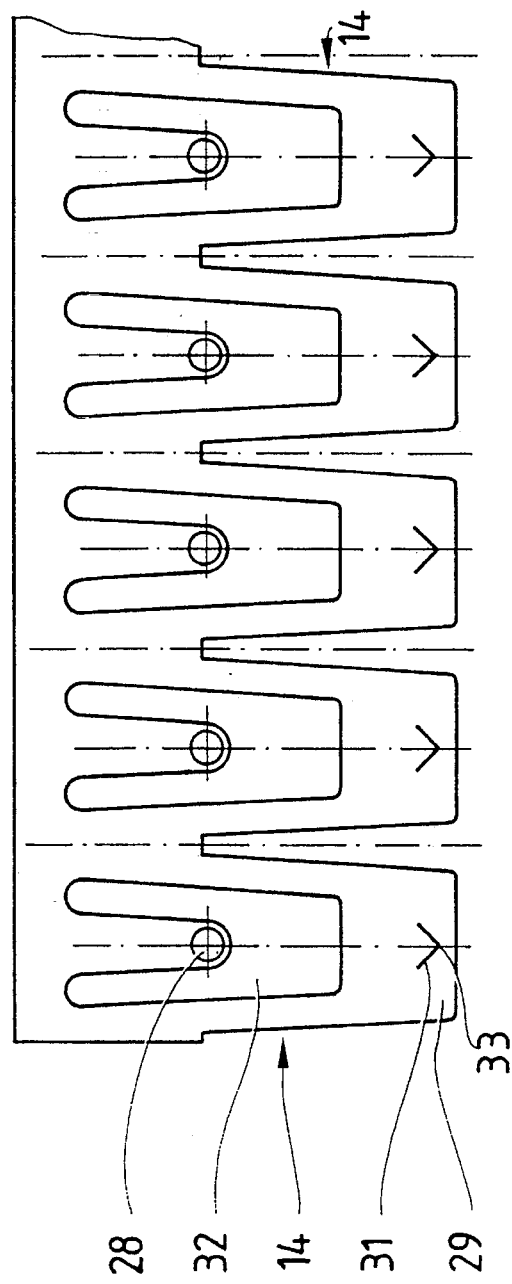

HF-TIGHT COMPONENT CARRIER

CROSS REFERENCE TO RELATED APPLICATION

This application claims the priority of Patent Application Serial No. DE P 4,223,322.4 filed Jul. 16th, 1992 in the Federal Republic of Germany, the subject matter of which is incorporated herein by reference.

BACKGROUND OF THE INVENTION

The present invention relates to an HF-tight component carrier for the insertion of the components of electrical and electronic devices, the carrier including two upper module rails and two lower, parallel module rails; two side walls which are screwed to the ends of the module rails; a bottom provided below the lower module rail, and a cover which is detachably fastened to the upper module rails; with the cover supporting two beveled, narrow edge strips, with each of the two upper module rails being provided with a longitudinal groove which is engaged by the edge strips on the fixed cover; and with at least one metallic spring element resting in each longitudinal groove to ensure electrical contact between the module rail and the cover.

The invention is used in component carriers which require a very high shielding effect against exterior electromagnetic influences or into which components are inserted which develop electromagnetic interference fields that must not extend into the environment.

High-frequency-tight component carriers and the means and measures to shield them from and against the exterior are known. The shield of a component carrier comprising a frame assembled of four module rails and two side walls is usually composed of the side walls themselves, a rear wall, a front panel, a bottom and a cover. This results in the construction of a metal housing which is closed on all sides and whose shielding effect depends solely on the quality of the electrical contact the surrounding components make with one another, since separating grooves are unavoidable. Such contact is made by employing fastening screws which are spaced very closely next to one another, with the help of inserted, electrically contacting seals, wire netting or electrically conductive thin packing cords. In this case, the grooves between the housing and those of the shielding elements, which have to be removed frequently for maintenance, cause special problems, since the shielding effect must not deteriorate, even after repeated removal.

It is known to seal the separating groove between a removable metal cover sheet and the profiled rails in a component carrier against high frequencies by inserting a laminar spring strip longitudinally into a partially covered longitudinal groove of the module rails. An edge strip of the metal cover sheet engages an open slot in the longitudinal groove and, as a result, the resilient laminae of the spring element create a series of electrical contacts between the module rail and the cover. The drawback here is that, prior to the assembly of the component carrier, the spring strip can be inserted into its groove only from the side, and the strip must be positioned in the interior of the groove (DE-OS [Unexamined Published German Patent Application] 3,928,461.

A contract spring strip for electromagnetically sealing housing parts of a shielding housing is also known (DE-GM [German Utility Model Patent] 91/06,954), which comprises a plurality of individual contact springs that are connected to one another via separating webs. Each of these contact springs is provided on one side with an inwardly bent edge region which serves to encircle the exterior edge of a housing member, and on the other side it bears a spring hook which is also bent inwardly and engages an opening of a second housing member that is to be pushed on. Contact spring strips configured in such a way are not usable for sealing a removable cover and module rails in a component carrier against high frequencies.

Moreover, a high-frequency-tight housing was proposed in which a spring metal strip is provided as an HF-seal between the lower part of the housing and a cover gripping over it. A U-shaped portion of this metal strip is plugged onto the edge of the cover, and shaped-on spring tongues, bent in the shape of a roof, resiliently engage the space provided for this purpose between the edge of the cover and the side wall of the housing. These spring metal strips are also not usable for the HF-tight construction of component carriers (DE-OS 3,523,770).

SUMMARY OF THE INVENTION

It is an object of the present invention to provide a component carrier having a technically improved high-frequency seal between the detachable cover and the upper module rails which is provided by means of a spring member, the latter being very easily installable without requiring positioning.

The starting point for attaining this object was an HF-tight component carrier of the type described above and the problem was solved in that the longitudinal groove was given a V-shaped profile, which is formed by a planar rear wall and a concave front wall which faces the rear wall and is contiguous to it. The spring member fits into the longitudinal groove and has a V-shaped cross section, which corresponds to the profile of the longitudinal groove and is inserted in a clamping manner into the longitudinal groove. The spring member includes both a planar rear leaf for contacting the rear wall of the longitudinal groove and a spring leaf which is placed at an acute angle against the rear leaf and presses against the front wall of the longitudinal groove. Near the free edge of the rear leaf, a planar spring tongue is placed which is spread away from the rear leaf at an acute angle and points with its free end in the direction of the spring leaf.

The proposed arrangement allows for the insertion of the spring member from the top into the open longitudinal groove of the module rails, with the member, due to its shape and the shape of the groove, automatically assuming its intended position and maintaining the same both during mounting as well as during repeated dismounting of the cover. On account of the spring member, a flawless and permanent contact with the edge strip of the cover is ensured, and it is further advantageous that, during manufacturing of the component carrier, the spring member may be pre-mounted, or for component carrier kits, the module rails may be delivered with the spring members inserted.

It is advisable to manufacture the spring member by punching it out in one piece and to provide it with a U-shaped recess for forming the tongue of the spring.

The tongue of the spring is advantageously provided with at least on contact cap. This contact cap ensures the defined contact position, and, particularly, high specific contact pressures.

In order to obtain a flawless fit of the spring member on the concave front wall of the longitudinal groove of the module rail, the free longitudinal edge of the spring member may be beveled at an obtuse angle toward the rear wall.

The spring element may be equipped with at least one claw directed toward the exterior. This effectively prevents the unintentional displacement or detachment of the spring member that is pressed into the longitudinal groove.

Advantageously, the claw is a pushed-through triangle whose vertex points toward the free longitudinal edge of the spring member and in a direction opposite to the direction in which the spring member is clamped in. Due to this configuration, it is very easy to manufacture the claw and its tip, which, after installation is completed, penetrates the front wall of the longitudinal groove and passes through surface layers of possibly poorer conductivity, resulting in an outstanding electrical contact.

It is appropriate for the rear leaves of a plurality of spring members to be connected to one another by means of connecting strips and thus form a band that may be rolled up and from which, during the installation, the required number of spring members corresponding to the length of the longitudinal groove, may be broken off or cut off, respectively.

If conditions require, each of the two lower module rails may also be provided with a longitudinal groove and a spring member which is engaged by beveled, narrow edge strips of the bottom. On account of this measure, the components inserted into the component carrier may also be accessed from below after the bottom is removed.

According to a further feature of the invention, the module rails may carry a holding strip along the rear wall of their longitudinal groove. This holding strip serves to improve the mounted position of the spring member as soon as the edge of its rear leaf snaps in underneath the holding strip.

BRIEF DESCRIPTION OF THE DRAWINGS

The invention is explained in greater detail below by way of an embodiment and with the help of the attached drawings, in which:

FIG. 2 is a front view of a plurality of interconnected spring members several times enlarged;

FIG. 3 is a cross-sectional view of a spring member as shown in FIG. 2 and cut along line III—III in FIG. 2;

FIG. 4 depicts the outline of a cut-to-size metal sheet for a plurality of contiguous spring members as shown in FIGS. 2 and 3.

DETAILED DESCRIPTION OF THE PREFERRED EMBODIMENT

Figure 1:
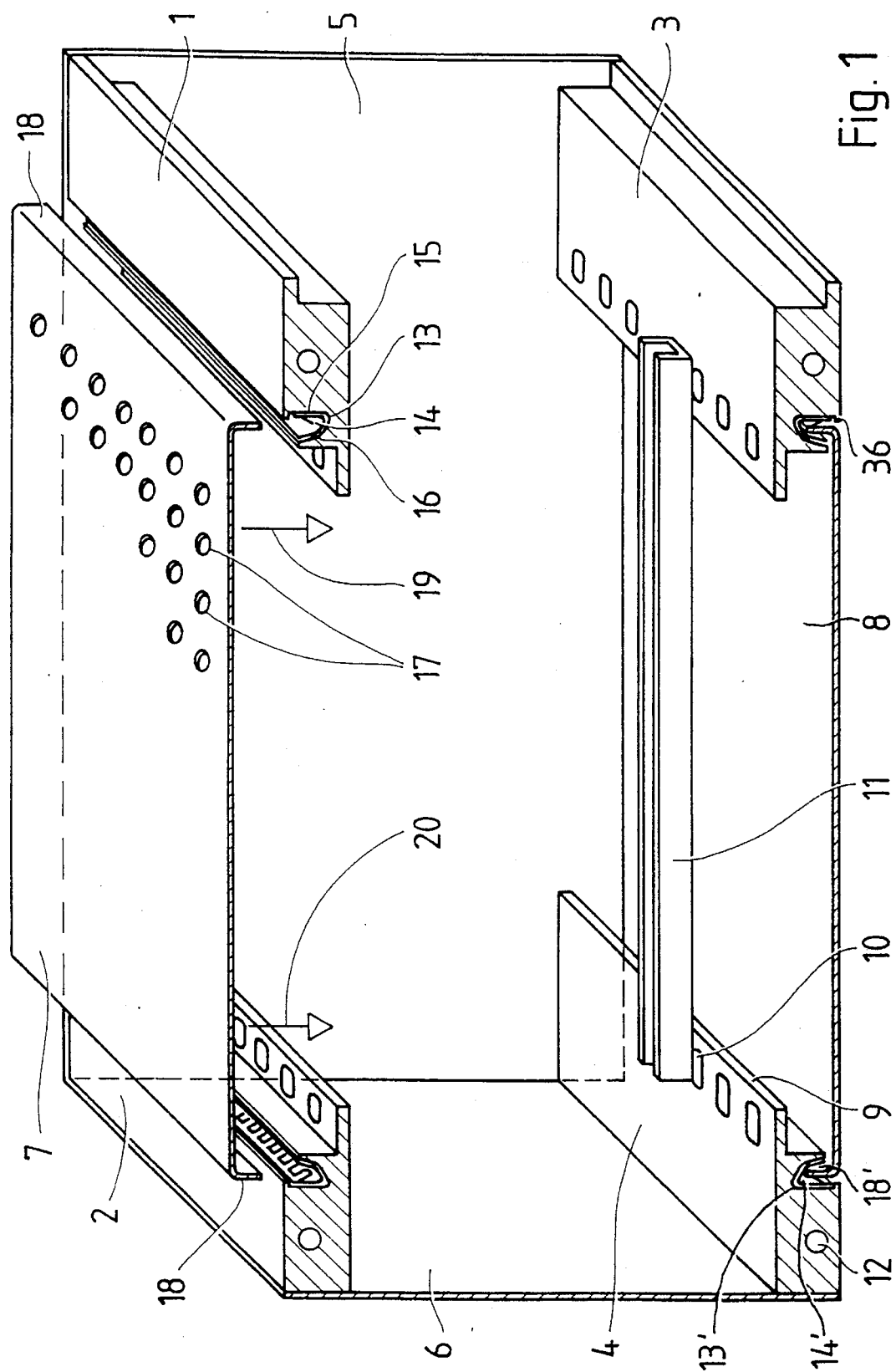
FIG. 1 is a perspective view of a cross section of an HF-tight component carrier in approximately actual size.

The prismatic HF-tight component carrier is shown in FIG. 1 in a sectional, somewhat simplified perspective view. Made of metal (preferably aluminum), the component carrier serves to receive groups of components assembled on printed circuit boards for electrical and electronic devices. This component carrier is provided with two upper, profiled module rails 1 and 2; two lower, identically configured module rails 3 and 4; two side walls 5 screwed to the ends of the equally long modular rails 1 to 4; a rear wall 6, a cover 7, and a bottom 8.

The parallel module rails, 1, 2, 3 and 4 are configured as extruded profiles and are provided with a strip 9 having longitudinal holes 10, with the help of which guide rails 11 are fastened between the upper module rails 1 and 2 and the lower module rails and 3 and 4 that serve to insert the (non-illustrated) printed circuit boards of the components. An oblong hole 12 in the profiles at the ends of module rails 1 to 4 may be provided with an interior thread for screwing on the side walls 5.

The two upper module rails 1 and 2 and the two lower module rails 3 and 4 are each provided with a longitudinal groove 13 whose opening is directed toward the exterior or upward and downward, respectively. Spring members 14 rest in each of these longitudinal grooves 13. The longitudinal groove 13 has a substantially V-shaped profile, which is formed by a planar rear wall 15 and a concave front wall 16 opposite rear wall 15 and which with it forms a continuous connection.

The planar and rectangular side walls 5, which are made of aluminum sheet, are screwed into interior threads of the oblong holes 12 by using cap screws (not shown) on the four module rails 1 to 4 so as to form a frame.

The elongated, rectangular rear wall 6 which is also made of aluminum is fastened so as to be sealed against high frequencies (not shown) to the rear faces of the two rear module rails 2 and 4, something which may be done, for example, with a plurality of fastening screws arranged closely next to one another.

The cover 7, which in FIG. 1 is shown slightly above the component carrier and which is provided with ventilation holes 17, is provided in the front and in the rear with two rectangular, beveled, narrow edge strips 18. If the cover 7 is mounted, these edge strips 18 engage the longitudinal grooves 13 of two upper module rails 1 and 2 in the direction of the two arrows 19 and 20.

In each of the longitudinal grooves 13 of the two upper module rails 1 and 2, a band-shaped spring member 14 is inserted in a clamping manner. This element creates an electrical contact between the module rail 1 and 2, respectively, and the cover 7, if the cover 7 is mounted and screwed with fastening screws (not shown) to the upper module rails 1 and 2.

The spring member 14 fits into the longitudinal groove 13, which, for this purpose, has a substantially V-shaped cross section that corresponds to the V-profile of the longitudinal groove 13.

The spring member 14, which is made, for example, in one piece of stainless steel, is provided with—see FIGS. 2 and 3—a planar rear leaf 21 and a spring leaf 22, which is attached to the rear leaf 21 at an acute angle 23 of approximately 75 degrees. If the spring member 14 is clamped into the longitudinal groove 13, the spring leaf 22 pivots resiliently in the direction of the rear leaf 21, resulting in the rear leaf 21 contacting the rear wall 15 of the longitudinal groove 13 and spring leaf 22 pressing against the concave front wall 16, as shown in FIG. 1.

Near the free edge 24 of the rear leaf 21 of the spring member 14, a planar spring tongue 25 is attached which is spread away at an acute angle 26 of approximately 20 degrees from the rear leaf 21, with its free end 27 pointing toward spring leaf 22. This spring tongue 25 supports near its free end 27 a spherical contact cap 28 of a circular shape.

The free longitudinal edge 29 of the spring leaf 22 is beveled at an obtuse angle 30 in the direction of rear leaf 21. The spring leaf 22 is provided with a claw 31 directed toward the exterior (away from the rear leaf 21).

The spring member 14 is made of one piece by punching it out of a sheet metal strip. For forming the spring tongue 25, the spring member 14 is provided with a U-shaped recess 32. The claw 31 is a triangle which is pushed through when punched out (see FIGS. 2 and 4), whose vertex 33 points toward the free longitudinal edge 29 of the spring leaf 22 and thus in a direction opposite to the direction in which the element 14 is clamped in.

The rear leaves 21 of a plurality of spring members 14 are connected to one another via connecting strips 34 and thus form a very easily separable band 35.

In the component carrier shown in FIG. 1, each of the two lower module rails 3 and 4 are also provided with a longitudinal groove 13' into which a spring member 14' is clamped. This longitudinal groove 13' and this spring member 14' are configured exactly like longitudinal grooves 13 and spring members 14 of the two upper module rails 1 and 2. The bottom 8 supports edge strips 18' corresponding to cover 7 and ensures electrical contact between module rails 3 and 4, respectively, if the bottom 8 is mounted and screwed on as shown.

Module rails 1 to 4 are provided along the rear wall 15 of their longitudinal grooves 13, 13' with a holding strip 36 having a square cross section against which abuts the edge 24 of the rear leaf 21 of the clamped-in spring member 14 and 14', respectively.

It will be understood that the above description of the present invention is susceptible to various modifications, changes an adaptations, and the same are intended to be comprehended within the meaning and range of equivalents of the appended claims.

What is claimed is:

1. An HF-tight component carrier for receiving components of electrical and electronic devices inserted therein, comprising:

two upper, parallel module rails, each having a longitudinal groove extending in a direction of a length of the respective rails, each groove having a substantially V-shaped cross-sectional profile which is open toward an exterior of the component carrier and which is formed by a planar rear wall and a concave front wall opposite and contiguous with the rear wall;

two lower, parallel module rails;

two oppositely located side walls fastened to the respective ends of the upper and lower module rails;

a bottom provided below the lower module rails;

a cover detachably fastened to the upper module rails, and having two beveled, narrow edge strips, each projecting towards, and engagable with, a respective longitudinal groove; and at least one metal spring member having a V-shaped cross sectional profile corresponding essentially to the profile of the longitudinal groove and being inserted in a clamping manner into the respective longitudinal grooves to ensure electrical contact between the respective module rail and the detachably fastened cover, the spring member including a planar rear leaf portion that contacts the rear wall of the longitudinal groove, a spring leaf portion attached to the rear leaf portion to form a first acute angle therebetween and which presses against the front wall of the longitudinal groove, and a spring tongue attached near a free edge of the rear leaf portion and being spread away from the rear leaf portion at a second acute angle so that a free end thereof points toward the spring leaf portion for engagement with a respective edge strip of the cover.

2. The HF-tight component carrier defined in claim 1, wherein the spring member is formed from one piece, and wherein the spring tongue is formed by a U-shaped recess provided in the rear leaf portion.

3. The HF-tight component carrier defined in claim 1, wherein the spring tongue includes at least one contact cap formed thereon.

4. The HF-tight component carrier defined in claim 1, wherein a free longitudinal edge of the spring leaf portion is beveled at an obtuse angle toward the rear leaf portion.

5. The HF-tight component carrier defined in claim 1, wherein the spring leaf portion includes at least one claw which projects toward the exterior of the component carrier.

6. The HF-tight component carrier defined in claim 5, wherein the claw is formed by a triangle portion that is pushed-through the spring leaf portion so that the vertex of the triangle portion points toward a free longitudinal edge of the spring leaf portion and in a direction opposite to a direction in which the spring member is clamped in the groove.

7. The HF-tight component carrier defined in 1, wherein said at least one spring member comprises a plurality of spring members; further comprising at least one connecting strip connecting adjacent spring members to one another by way of their respective rear leaf portions to form a band of spring members.

8. The HF-tight component carrier defined in claim 1, wherein each of the two lower module rails includes a longitudinal groove similarly configured to the longitudinal grooves of the upper module rails for receiving respective spring members, and wherein the bottom has two beveled, narrow edge strips, each projecting towards, and engagable with, a respective longitudinal groove and spring member for detachably fastening the bottom to the lower module rails.

9. The HF-tight component carrier defined in claim 1, wherein at least the upper module rails each have a holding strip formed along the rear wall of their respective longitudinal groove for retaining the spring member therein.

10. The HF-tight component carrier defined in claim 1, wherein the side walls are screwed to the respective ends of the module rails.

* * * * *